(12) United States Patent
Obuchi et al.

(10) Patent No.: US 10,784,420 B2
(45) Date of Patent: Sep. 22, 2020

(54) SEMICONDUCTOR LIGHT EMITTING DEVICE

(71) Applicant: ROHM CO., LTD., Kyoto (JP)

(72) Inventors: Hirotaka Obuchi, Kyoto (JP); Junichi Itai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/260,933

(22) Filed: Jan. 29, 2019

(65) Prior Publication Data

US 2019/0157526 A1 May 23, 2019

Related U.S. Application Data

(63) Continuation of application No. 15/859,845, filed on Jan. 2, 2018, now Pat. No. 10,230,028.

(30) Foreign Application Priority Data

Mar. 23, 2017 (JP) .................................. 2017-058285

(51) Int. Cl.
| | | |
|---|---|---|
| *H01L 33/56* | (2010.01) | |
| *H01L 33/06* | (2010.01) | |
| *H01L 33/12* | (2010.01) | |
| *H01L 33/62* | (2010.01) | |
| *H01L 33/32* | (2010.01) | |
| *H01L 33/42* | (2010.01) | |
| *H01L 33/60* | (2010.01) | |
| *H01L 33/14* | (2010.01) | |
| *H01L 51/52* | (2006.01) | |
| *H01L 51/10* | (2006.01) | |
| *H01L 51/44* | (2006.01) | |
| *H01L 33/58* | (2010.01) | |

(52) U.S. Cl.
CPC .............. *H01L 33/56* (2013.01); *H01L 33/06* (2013.01); *H01L 33/12* (2013.01); *H01L 33/145* (2013.01); *H01L 33/32* (2013.01); *H01L 33/42* (2013.01); *H01L 33/60* (2013.01); *H01L 33/62* (2013.01); *H01L 33/58* (2013.01); *H01L 51/107* (2013.01); *H01L 51/448* (2013.01); *H01L 51/5246* (2013.01)

(58) Field of Classification Search
CPC ..... H01L 33/56; H01L 51/107; H01L 51/448; H01L 51/5246
See application file for complete search history.

(56) References Cited

U.S. PATENT DOCUMENTS 6,255,738 B1    7/2001  Distefano et al.
2004/0126592 A1*  7/2004  Shibahara ................ C08K 3/40
                                                          428/441

(Continued)

FOREIGN PATENT DOCUMENTS

JP          2010-067862        3/2010

*Primary Examiner* — George R Fourson, III

(74) *Attorney, Agent, or Firm* — Hamre, Schumann, Mueller & Larson, P.C.

(57) ABSTRACT

A semiconductor light emitting device includes a substrate made of resin, a first wiring and a second wiring formed on the substrate, a light emitting element disposed on the substrate and electrically connected to the first wiring and the second wiring, and a transparent sealing resin configured to seal the light emitting element. The substrate contains an acrylic resin, and the sealing resin contains silicone.

46 Claims, 12 Drawing Sheets

(56) References Cited

U.S. PATENT DOCUMENTS

| | | |
|---|---|---|
| 2005/0003576 A1 | 1/2005 | Umemoto et al. |
| 2007/0114555 A1* | 5/2007 | Takemoto ............ G02B 6/0073 257/99 |
| 2012/0012881 A1* | 1/2012 | Lee ..................... H01L 33/48 257/98 |
| 2013/0069518 A1* | 3/2013 | Kamijo ................ H01L 33/486 313/292 |
| 2013/0147345 A1 | 6/2013 | Maeda et al. |
| 2013/0193477 A1 | 8/2013 | Katayama et al. |
| 2013/0248827 A1 | 9/2013 | Togano et al. |
| 2016/0087164 A1* | 3/2016 | Kawano ............... H01L 33/504 349/65 |
| 2017/0047381 A1 | 2/2017 | Takata |
| 2017/0162607 A1 | 6/2017 | Abe |
| 2017/0317300 A1 | 11/2017 | Nishi et al. |
| 2018/0269417 A1 | 9/2018 | Sudo et al. |

* cited by examiner

SEMICONDUCTOR LIGHT EMITTING DEVICE

CROSS-REFERENCE TO RELATED APPLICATION(S)

This application is a Continuation of application Ser. No. 15/859,845, filed Jan. 2, 2018, which is based upon and claims the benefit of priority from Japanese Patent Application No. 2017-058285, filed on Mar. 23, 2017, the entire contents of which are incorporated herein by reference.

TECHNICAL FIELD

The present disclosure relates to a semiconductor light emitting device.

BACKGROUND

For example, in the related art, there has been disclosed a light emitting device including a resin vessel with a recess, an anode lead portion and a cathode lead portion installed to be exposed on a bottom surface of the recess, a semiconductor light emitting element installed in the cathode lead portion on the bottom surface of the recess, and a sealing resin installed so as to cover the recess. The sealing resin includes a phosphor powder and a transparent resin in which the phosphor powder is dispersed, and for example, a silicon resin is used as the transparent resin.

Recently, applications of semiconductor light emitting devices such as backlights of liquid crystal displays, various kinds of lightings or the like have been rapidly expanding, and the semiconductor light emitting devices have been required to have a long lifespan and a high output. As the output of semiconductor light emitting devices increases, the energy of light emitted from the light emitting element also increases. Therefore, in order to suppress the deterioration due to the light energy, a resin having relatively high heat resistance and light resistance is used as the resin for sealing the light emitting element.

The absorption of light in the sealing resin is suppressed to thereby reduce the deterioration by using the sealing resin having high heat resistance and high light resistance, but there is a possibility that most of the light energy emitted from the light emitting element is received by a resin substrate supporting the light emitting element.

SUMMARY

Some embodiments of the present disclosure provide a semiconductor light emitting device in which both a substrate and a sealing resin have high heat resistance and high light resistance, and can realize a long lifespan and a high output.

According to one embodiment of the present disclosure, a semiconductor light emitting device includes a substrate made of resin, a first wiring and a second wiring formed on the substrate, a light emitting element disposed on the substrate and electrically connected to the first wiring and the second wiring, and a transparent sealing resin configured to seal the light emitting element. The substrate contains an acrylic resin, and the sealing resin contains silicone.

According to one embodiment of the present disclosure, the substrate exhibits a spectrum including at least a first peak near a wavenumber of 1,698 $cm^{-1}$, a second peak near a wavenumber of 1,510 $cm^{-1}$, and a third peak near a wavenumber of 1,448 $cm^{-1}$ in FT-IR measurement, and is made of a light resistant resin in which a peak height of the first peak is higher than a peak height of the second peak.

According to one embodiment of the present disclosure, the substrate exhibits a spectrum further including a fourth peak near a wavenumber of 1,257 $cm^{-1}$ and a fifth peak near a wavenumber of 1,060 $cm^{-1}$ in the FT-IR measurement.

According to one embodiment of the present disclosure, with respect to a reference spectrum obtained by FT-IR measuring an epoxy resin derived from bisphenol A in the FT-IR measurement, the sealing resin does not include peaks near wavenumbers of 1,510 $cm^{-1}$ and 835 $cm^{-1}$ included in the reference spectrum and is made of a light resistant resin that exhibits a spectrum including peaks at the same wavenumber positions of a plurality of peaks of the reference spectrum.

According to one embodiment of the present disclosure, the substrate is made of a resin that exhibits a spectrum including a peak derived from a C=O bond, a peak derived from a benzene ring, and a peak derived from an Si—O—Si bond in the FT-IR measurement.

According to one embodiment of the present disclosure, the first wiring includes a first island on which the light emitting element is mounted, and a second island connected to the light emitting element by a first bonding member, and the second island is disposed to cross at a position of the light emitting element and avoid a first region in a first direction of the substrate and a second region in a second direction intersecting the first direction of the substrate.

According to another embodiment of the present disclosure, the second wiring includes a third island connected to the light emitting element by a second bonding member, and the third island is disposed at a position diagonal to the second island with the first island interposed therebetween.

According to one embodiment of the present disclosure, the semiconductor light emitting device further includes a first insulating protective layer formed on the substrate so as to selectively cover the first wiring and a second insulating protective layer formed on the substrate so as to selectively cover the second wiring. The first insulating protective layer and the second insulating protective layer are formed to have different patterns in plan view.

According to one embodiment of the present disclosure, a first recess is formed on the substrate so as to penetrate from a surface to a rear surface of the substrate, the first insulating protective layer is formed along a periphery of the first recess so that a first gap is formed between the first insulating protective layer and the first recess, and the first insulating protective layer includes a first terminal which is formed so as to wrap around the rear surface of the substrate from the first gap through the first recess and connected to the first wiring.

According to one embodiment of the present disclosure, a second recess is formed on the substrate so as to penetrate from a surface to a rear surface of the substrate, the second insulating protective layer is formed along a periphery of the second recess so that a second gap is formed between the second insulating protective layer and the second recess, and the second insulating protective layer includes a second terminal which is formed so as to wrap around the rear surface of the substrate from the second gap through the second recess and connected to the second wiring.

DETAILED DESCRIPTION

Embodiments of the present disclosure will now be described in detail with reference to the drawings.

Figure 1:
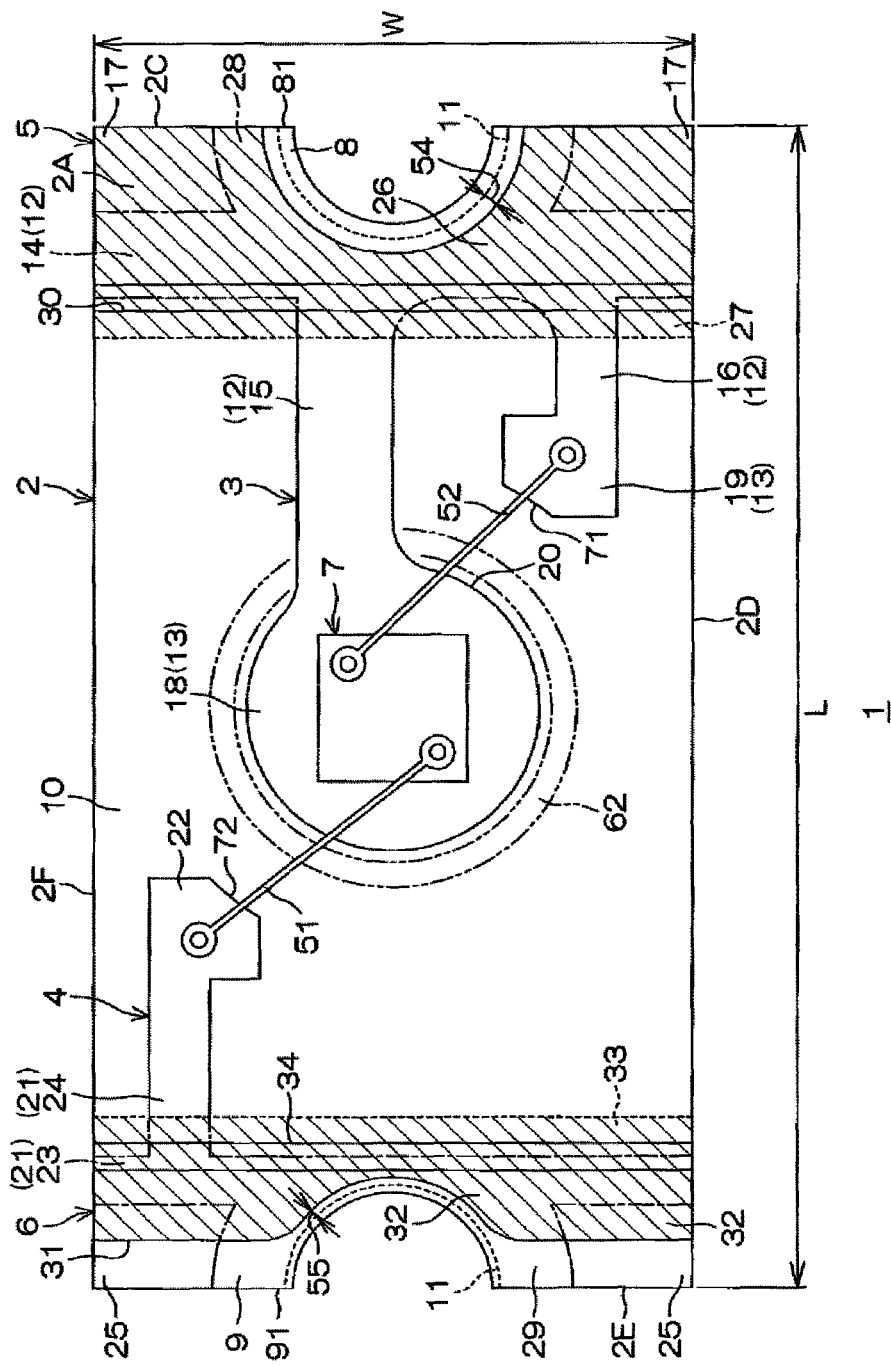
FIG. 1 is a plan view of a semiconductor light emitting device according to one embodiment of the present disclosure.
Figure 2:
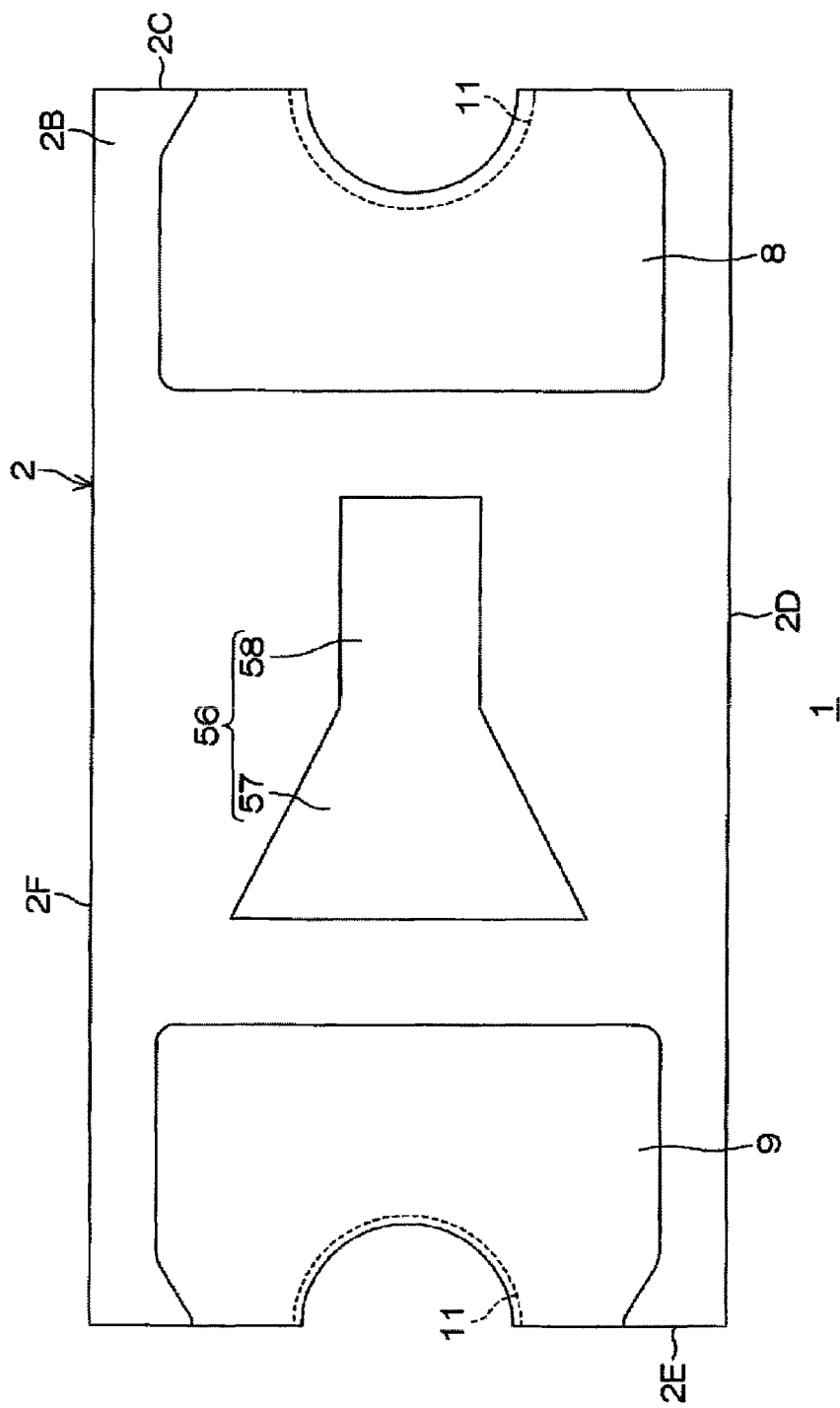
FIG. 2 is a bottom view of the semiconductor light emitting device according to one embodiment of the present disclosure.
Figure 3:
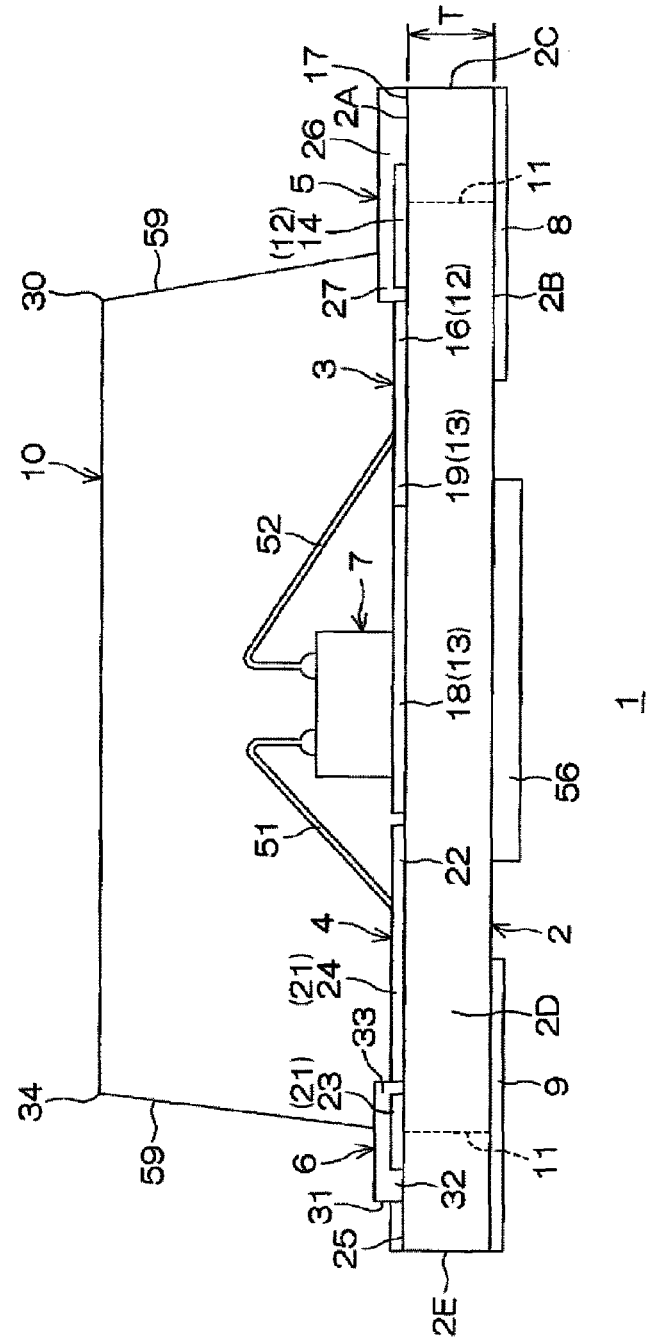
FIG. 3 is a side view of the semiconductor light emitting device according to one embodiment of the present disclosure.

FIG. 1 is a plan view of a semiconductor light emitting device 1 according to one embodiment of the present disclosure. FIG. 2 is a bottom view of the semiconductor light emitting device 1 according to one embodiment of the present disclosure. FIG. 3 is a side view of the semiconductor light emitting device 1 according to one embodiment of the present disclosure.

The semiconductor light emitting device 1 includes a substrate 2, an n-side wiring 3 (cathode wiring) as an example of a first wiring of the present disclosure, a p-side wiring 4 (anode wiring) as an example of a second wiring of the present disclosure, an n-side insulating protective layer 5 as an example of a first insulating protective layer of the present disclosure, a p-side insulating protective layer 6 as an example of a second insulating protective layer of the present disclosure, a light emitting element 7, an n-side terminal 8 (cathode terminal) as an example of a first terminal of the present disclosure, a p-side terminal 9 (anode terminal) as an example of a second terminal of the present disclosure, and a sealing resin 10.

The substrate 2 is made of, for example, a transparent resin having a rectangular plate shape, and includes a surface 2A, a rear surface 2B opposing the surface 2A, and end surfaces 2C, 2D, 2E, and 2F. The substrate 2 may have a size that a length L is 0.6 to 5.0 mm, a width W is 0.3 to 5.0 mm, and a thickness T is 0.05 to 1.0 mm. The substrate 2 may also be made of, for example, a resin impregnated in a glass cloth. The substrate 2 may also be a colored resin instead of the transparent resin.

Recesses 11 are formed in a pair of short side portions (short side portions along the end surfaces 2C and 2E) opposing each other in a longitudinal direction of the substrate 2, respectively. The pair of recesses 11 is arranged at the center of the substrate 2 in a width direction and faces each other in the longitudinal direction of the substrate 2. As illustrated in FIG. 3, the recesses 11 are formed to penetrate the short side portions of the substrate 2 from the front surface to the rear surface of the substrate 2, respectively. That is, the recesses 11 are formed by partially recessing the end surfaces 2C of the short side portions of the substrate 2 inward in a plan view (in bottom surface view), and in this embodiment, as illustrated in FIGS. 1 and 2, the recesses 11 have a substantially semi-circular shape.

The n-side wiring 3 is made of, for example, a metal material such as Cu, Ni, Au, Ag, Pd, Sn or the like, and includes a wiring portion 12 and an island portion 13 which are integrally formed in a predetermined pattern on the surface 2A of the substrate 2.

As illustrated in FIG. 1, the wiring portion 12 includes a base portion 14 disposed to extend from an inner side of the sealing resin 10 to an outer side thereof on one side of the substrate 2 in the longitudinal direction, and a first extending portion 15 and a second extending portion 16 which extend from a portion of an inner periphery of the base portion 14 toward an inner side of the sealing resin 10. The inner periphery of the base portion 14 is a periphery that faces the p-side wiring 4 along the width direction of the substrate 2, in the base portion 14.

The base portion 14, which has a pattern that exposes two surface corner portions 17 of the substrate 2 on one side in the longitudinal direction, is formed over the entire region (region from the end surface 2F to the end surface 2D) from one end to the other end of the substrate 2 in the width direction in the plan view illustrated in FIG. 1. The base portion 14 has a recess peripheral portion 28 that covers the edges of the recess 11 of the substrate 2. The base portion 14 is also formed to be flush with each of the end surfaces 2D and 2F of the substrate 2 in the longitudinal direction and exposed from each of the end surfaces 2D and 2F.

The first extending portion 15 linearly extends from a substantially central portion of the base portion 14 in the width direction toward the other side of the substrate 2 in the longitudinal direction. The second extending portion 16 linearly extends from a position, which is spaced apart from the first extending portion 15 of the base portion 14 in the width direction of the substrate 2, toward the other side of the substrate 2 in the longitudinal direction.

The island portion 13 includes an element island 18 and a wire island 19.

The element island 18 is an island on which the light emitting element 7 is mounted, and is disposed at the substantially center of the substrate 2 in both the longitudinal and width directions. The element island 18 is integrally connected to the first extending portion 15 of the wiring portion 12.

In this embodiment, the element island 18 has a circular shape having a diameter greater than a width of a wiring (first extending portion 15 in this embodiment) connected to the element island 18. The element island 18 may also have a shape other than the circular shape, e.g., a quadrangular shape or the like. Furthermore, the first extending portion 15 is connected closer to the opposite side of the second extending portion 16 than a central portion of the element island 18 in the width direction of the substrate 2. That is, the first extending portion 15 is disposed to be biased to one side of the element island 18 in the radial direction, so that the second extending portion 16 and the wire island 19 may be arranged in an empty region 20 on the other side of the element island 18. Thus, it is possible to secure a relatively large space between the first extending portion 15 and the second extending portion 16 and to cause the second extending portion 16 and the wire island 19 to approach the central portion of the substrate 2 in the width direction. For example, the second extending portion 16 and the wire island 19 may be arranged in the region 20 overlapping the element island 18 in the longitudinal direction of the substrate 2. As a result, it is possible to effectively utilize the space of the surface of the substrate 2 and to make the substrate 2 compact.

In addition, the element island 18 and the first extending portion 15 are used as a heat dissipation path that dissipates heat generated by the light emitting element 7. In this embodiment, the element island 18 and the first extending portion 15 are used as the heat dissipation path without direct electrical connection with the light emitting element 7 but may be used as the heat dissipation path with direct electrical connection with the light emitting element 7. Thus, it is possible to promote enhancement of heat dissipation efficiency by forming the first extending portion 15 wider than the second extending portion 16.

The wire island 19 is an island to which a bonding wire 52 to be described later is connected, and is arranged in a corner portion 17 of one side of the surface of the substrate 2 with respect to the element island 18. The wire island 19 is integrally connected to the second extending portion 16 of the wiring portion 12. In this embodiment, the wire island 19 has a curved periphery 71, which curvedly faces the element island 18 along its periphery and is formed as an arc of a concentric circle with the center of the element island 18, in its inner side, and has a substantially L shape. The wire island 19 may also have a shape other than the L shape, e.g., a circular, triangular, or quadrangular shape.

The p-side wiring 4 is made of, for example, a metal material such as Cu, Ni, Au, Ag, Pd, Sn or the like, and includes a wiring portion 21 and an island portion 22 which are integrally formed to have a predetermined pattern on the surface 2A of the substrate 2.

As illustrated in FIG. 1, the wiring portion 21 includes a base portion 23 arranged at the other side of the longitudinal direction (opposite side of the n-side wiring 3) to extend from an inner side to the outer side of the sealing resin 10 and a third extending portion 24 extending from a portion of an inner periphery of the base portion 23 toward the inner side of the sealing resin 10. The inner periphery of the base portion 23 is a periphery that faces the n-side wiring 3 along the width direction of the substrate 2, in the base portion 23.

The base portion 23, which is a pattern exposing two surface corner portions 25 of the substrate 2 on the other side in the longitudinal direction, is formed over the entire region (the region from the end surface 2F to the end surface 2D) from one end to the other end of the substrate 2 in the width direction, in the plan view illustrated in FIG. 1. The base portion 23 has a recess periphery portion 29 that covers the edges of the recess 11 of the substrate 2. The base portion 23 is also formed to be flush with each of the end surfaces 2D and 2F of the substrate 2 in the longitudinal direction and exposed from each of the end surfaces 2D and 2F.

The third extending portion 24 linearly extends from a position, which is diagonal to the second extending portion 16 toward one side of the substrate 2 in the longitudinal direction with the element island 18 interposed therebetween, in the base portion 23.

The island portion 22, which is an island (or a wire island) to which a bonding wire 51 to be described later is connected, is disposed at a position diagonal to the wire island 19 of the n-side with the element island 18 interposed therebetween. In this embodiment, the island portion 22 has a curved periphery 72, which curvedly faces the element island 18 along its periphery and is formed as an arc of a concentric circle with the center of the element island 18 on its inner side, and has a substantially L shape. The island portion 22 may also have a shape other than an L shape, e.g., a circular, triangular, or quadrangular shape.

The n-side insulating protective layer 5 is formed on the substrate 2 so as to cover the wiring portion 12 of the n-side wiring 3. In this embodiment, the n-side insulating protective layer 5 is formed to extend from the inside to the outside of the sealing resin 10, and a portion of the n-side insulating protective layer 5 is covered by the sealing resin 10 and the remaining portion thereof is exposed to the outside of the sealing resin 10. Specifically, the n-side insulating protective layer 5 integrally includes an outer portion 26 exposed to the outside of the sealing resin 10 and an inner portion 27 covered by the sealing resin 10.

The outer portion 26 of the n-side insulating protective layer 5 is formed to have a pattern along the base portion 14 of the wiring portion 12 of the n-side wiring 3 so as to cover the corner portion 17 on the surface of the substrate 2. Since the wiring portion 12 is covered by the n-side insulating protective layer 5 in the region from the end surface 2D to the end surface 2F of the substrate 2, it is possible to suppress generation of a valley in the wiring portion 12 when the substrate is divided during a manufacturing process of the semiconductor light emitting device 1. The wiring portion 12 is also exposed on the end surfaces 2D and 2F of the substrate 2.

The inner portion 27 of the n-side insulating protective layer 5 is formed to uniformly protrude from the outer portion 26 to the other side in the longitudinal direction of the substrate 2 over the entire region from the end surface 2F to the end surface 2D in the width direction of the substrate 2 so as to cover each base end portion (connection portions between the respective extending portions 15 and 16 and the base portion 14) of the first extending portion 15 and the second extending portion 16 of the wiring portion 12. Thus, the region outside the upper edge 30 on one side of the sealing resin 10 in the longitudinal direction is entirely covered by the inner portion 27 of the n-side insulating protective layer 5.

The p-side insulating protective layer 6 is formed on the substrate 2 so as to cover the wiring portion 21 of the p-side wiring 4. In this embodiment, the p-side insulating protective layer 6 is formed over the inside of the sealing resin 10, a portion of the p-side insulating protective layer 6 is covered by the sealing resin 10 and the remaining portion thereof is exposed to the outside of the sealing resin 10. Specifically, the p-side insulating protective layer 6 integrally includes an outer portion 32 exposed to the outside of the sealing resin 10 and an inner portion 33 covered by the sealing resin 10.

The outer portion 32 of the p-side insulating protective layer 6 is formed in a pattern along the base portion 23 of the wiring portion 21 of the p-side wiring 4 so as to expose the corner portion 25 on the surface of the substrate 2 and a portion of the recess peripheral portion 29 of the wiring portion 21. Thus, the outer portion 32 is formed to retreat to the inner side of the substrate 2 with respect to the end surface 2E of the substrate 2, and an exposed region 31 in which the surface corner portion 25 and the recess peripheral portion 29 are exposed is formed between the outer portion 32 and the end surface 2E of the substrate 2. Since the wiring portion 21 is covered by the p-side insulating protective layer 6 from the end surface 2F to the end surface 2D of the substrate 2, it is possible to suppress generation of a valley in the wiring portion 21 when the substrate is divided during the manufacturing process of the semiconductor light emitting device 1. The wiring portion 21 is also exposed on the end surfaces 2D and 2F of the substrate 2.

The inner portion 33 of the p-side insulating protective layer 6 is formed to uniformly protrude from the outer portion 32 to one side in the longitudinal direction of the substrate 2 over the entire region from the end surface 2F to the end surface 2D in the width direction of the substrate 2 so as to cover the base end portion (connection portion between the third extending portion 24 and the base portion 23) of the third extending portion 24 of the wiring portion 21. Thus, the region outside the upper edge 34 on the other side of the sealing resin 10 in the longitudinal direction is entirely covered by the inner portion 33 of the p-side insulating protective layer 6.

As described above, the peripheral portion of the p-side insulating protective layer 6 is formed to retreat to the inner side of the substrate 2 with respect to the end surface 2E of the substrate 2, whereas the peripheral portion of the n-side insulating protective layer 5 is formed to be flush with the end surface 2C of the substrate 2. Thus, it is possible to identify the polarity of the semiconductor light emitting device 1 by, for example, checking the presence and absence of the exposed region 31 adjacent to the p-side insulating protective layer 6 or the recess peripheral portion 29 of the wiring portion 21 exposed to the exposed region 31, in the plan view of the semiconductor light emitting device 1. That is, by making the patterns of the insulating layer for protecting the wiring on the substrate 2 different on the n side and the p side, it is possible to easily recognize the polarity of the semiconductor light emitting device 1 even on the surface side of the semiconductor light emitting device 1, without checking a polarity mark 56 (as described hereinbelow) of the rear surface 2B of the substrate 2.

Here, both the n-side insulating protective layer 5 and the p-side insulating protective layer 6 may be made of, for example, a dry film resist.

Figure 4A:
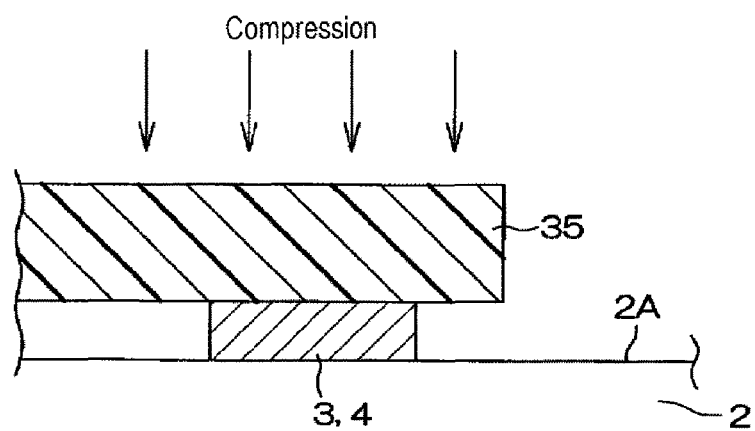
FIGS. 4A and 4B are views illustrating a sectional shape of an insulating protective layer and a manufacturing process.

In this case, as illustrated in FIG. 4A, the n-side insulating protective layer 5 and the p-side insulating protective layer 6 are formed by, for example, placing a dry film resist 35 having a predetermined pattern on the substrate 2 so as to cover the n-side wiring 3 and the p-side wiring 4 and compressing the dry film resist 35 by a dry film laminator (not shown).

Figure 4B:
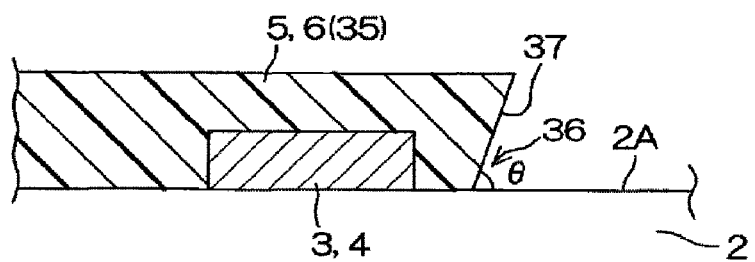

Since the peripheral portion of the dry film resist 35 is bent due to compression, a reverse-taper end surface 37 inclined from the front surfaces of the n-side and p-side insulating protective layers 5 and 6 toward the rear surfaces thereof is formed in the n-side insulating protective layer 5 and the p-side insulating protective layer 6 so as to form a space 36 on a lower side of the peripheral portion of the dry film resist 35 as illustrated in FIG. 4B. That is, an angle θ formed between the end surface 37 and the surface 2A of the substrate 2 is an acute angle.

Figure 5:
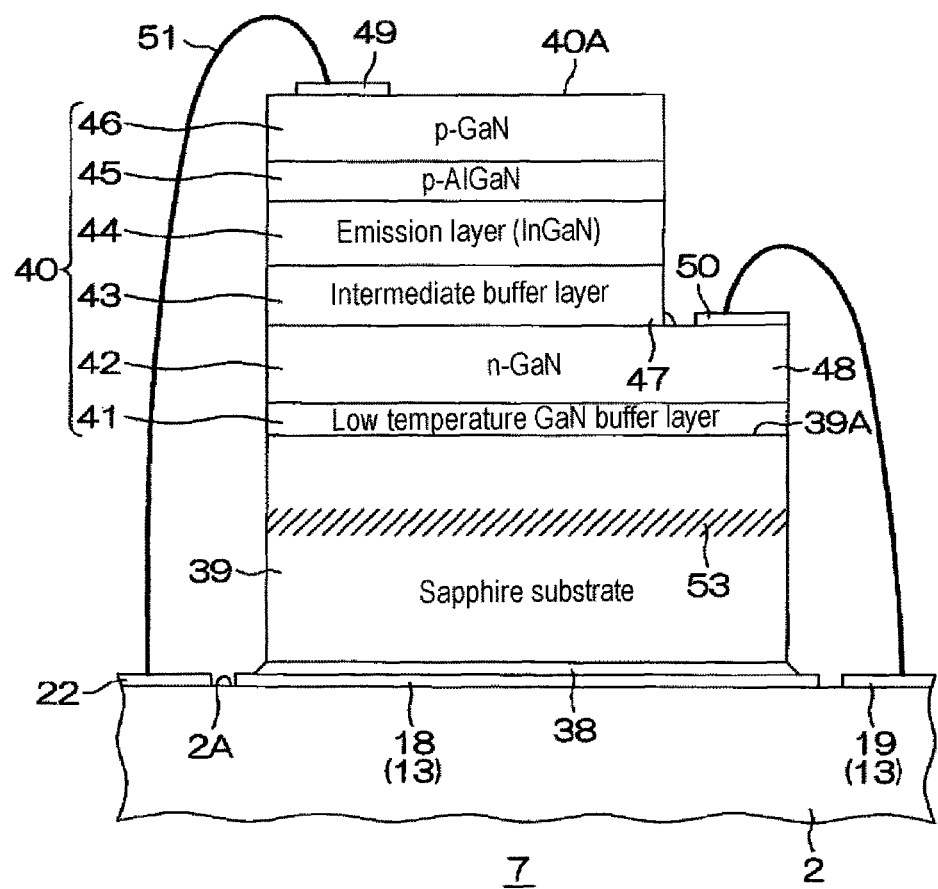
FIG. 5 is a schematic cross sectional view of the light emitting element of FIG. 1.

Next, a configuration of the light emitting element 7 will be described with reference to FIG. 5, in addition to FIGS. 1 to 3.

The light emitting element 7 is die-bonded to the element island 18 of the n-side wiring 3 through, for example, a die attach agent 38 (paste).

The light emitting element 7 has an element body formed by growing a group III nitride semiconductor layer 40 forming a group III nitride semiconductor laminate structure on a sapphire substrate 39.

The group III nitride semiconductor layer 40 has a laminate structure formed by laminating an n-type low temperature GaN buffer layer 41 and an n-type GaN contact layer 42, which are as an example of n-type layers, an intermediate buffer layer 43, an emission layer 44, and a p-type AlGaN electron inhibition layer 45 and a p-type GaN contact layer 46 as an example of p-type layers sequentially from the side of the sapphire substrate 39. A recess 47 is formed by selectively removing (e.g., etching) a portion of the group III nitride semiconductor layer 40 from the p-type GaN contact layer 46 to a depth at which the n-type GaN contact layer 42 is exposed such that the cross section of the group III nitride semiconductor layer 40 has a substantially rectangular shape. Furthermore, the n-type GaN contact layer 42 has a lead portion 48 drawn out from one side of the group III nitride semiconductor layer 40 in a lateral direction along the front surface of the sapphire substrate 39.

A p-side electrode (anode electrode) 49 is bonded to the surface of the p-type GaN contact layer 46, and an n-side electrode (cathode electrode) 50 is bonded to the lead portion 48 of the n-type GaN contact layer 42. Thus, a light emitting diode (LED) structure is formed.

Furthermore, the p-side electrode 49 and the island portion 22 of the p-side wiring 4 are connected to the bonding wire 51 as an example of a second bonding member of the present disclosure, and the n-side electrode 50 and the wire island 19 of the n-side wiring 3 are connected to a bonding wire 52 as an example of a first bonding member of the present disclosure. In addition, in FIGS. 1 to 3, since the structure of the light emitting element 7 is simplified for clarification, a configuration in which the bonding wire 51 and the bonding wire 52 are connected to the light emitting element 7 at the same height position is illustrated.

The n-type low temperature GaN buffer layer 41 is formed as an undoped (i.e., a dopant is not doped) GaN layer, which is crystal-grown at a wafer temperature of, for example, 400 to 700 degrees C. The thickness of the layer 41 is preferably tens of nm.

The n-type GaN contact layer 42 is formed with, for example, an n-type GaN layer in which silicon is added as an n-type dopant. It is desirable that the thickness of the layer 42 be set at 3 μm or more, specifically 3 to 7 μm. The doping concentration of silicon is, for example, about $1 \times 10^{18}$ cm$^{-3}$.

The intermediate buffer layer 43 has, for example, a super-lattice structure in which a silicon-doped InGaN layer (for example, having a thickness of about 4 nm) and a GaN layer (for example, having a thickness of about 2 nm) are alternately laminated on a predetermined cycle (e.g., about 5 cycles). In this embodiment, the InGaN layer is a layer expressed as $In_zGa_{1-z}N$ (where z=0.01~0.05), and the GaN layer is a layer containing no indium (In). The GaN layer may also contain a small amount of In within a range smaller than that of an In composition ratio (z) of the InGaN layer in the intermediate buffer layer 43.

The emission layer 44 generates light having a peak emission wavelength of 420 to 560 nm, and preferably, generates light having a peak emission wavelength of 440 to 540 nm. Here, the peak emission wavelength represents a wavelength of light (main peak) having its highest intensity among light emitted from the emission layer 44, and corresponds to a peak value of a spectrum distribution of emitted light. Thus, in the corresponding spectrum distribution, although there is a peak of a noise level other than a maximum peak, an emission wavelength of the peak of the noise level is not included in the "peak emission wavelength" of this embodiment.

For example, the emission layer 44 has a multi-quantum well (MQW) structure in which an InGaN layer (quantum well layer: a thickness of, for example, about 3 nm) and a silicon-doped GaN layer (barrier layer: a thickness of, for example, about 14 nm) are alternately laminated on a predetermined cycle (e.g., about eight cycles (pairs)). The overall thickness (total thickness) of the emission layer 44 is, for example, 60 to 150 nm.

The p-type AlGaN electron inhibition layer 45 is formed with, for example, an AlGaN layer with magnesium as a p-type dopant added. It is desirable that the thickness of the p-type AlGaN electron inhibition layer 45 be 3 nm or more, specifically 5 to 30 nm. The doping concentration of magnesium is, for example, about $3\times10^{19}$ cm$^{-3}$.

The p-type GaN contact layer 46 is formed with, for example, a GaN layer in which magnesium as a p-type dopant is added with high concentration. It is desirable that the thickness of the p-type GaN contact layer 46 be 0.1 μm or more, specifically 0.2 to 0.5 μm. The doping concentration of magnesium is about $10^{20}$ cm$^{-3}$. The surface of the p-type GaN contact layer 46 forms a surface 40A of the group III nitride semiconductor layer 40, and the surface 40A is a mirror surface. The surface 40A is a light extraction-side surface from which light generated by the emission layer 44 is extracted.

The p-side electrode 49 and the n-side electrode 50 are films formed with, for example, a Ti layer and an Al layer. In addition, the p-side electrode 49 and the n-side electrode 50 may be made of, for example, a material such as Cr, Au, Ni, AuSn, Rh, Pt, TiW, TiN or the like. Furthermore, a transparent electrode for anode contact may be formed in substantially the entire region of the surface 40A of the group III nitride semiconductor layer 40 between the p-side electrode 49 and the p-type GaN contact layer 46. The transparent electrode may be formed with a transparent thin metal layer including, for example, an Ni layer and an Au layer, a ZnO layer, indium tin oxide (ITO), and the like.

The sapphire substrate 39 is a substrate formed with a sapphire single crystal in which a polar plane (c plane in this embodiment) is a main plane 39A. Specifically, the main plane 39A of the sapphire substrate 39 may be a plane having an OFF angle of a predetermined size from a plane direction of the polar plane. Thus, a growth main plane (surface 40A) of the group III nitride semiconductor layer 40, which is crystal-grown on the sapphire substrate 39, is the same plane as the main plane 39A of the sapphire substrate 39, i.e., the polar plane (c plane in this embodiment). It is also desirable that the thickness of the sapphire substrate 39 be 50 μm or more, specifically 80 to 120 μm.

In addition, a processing mark 53 is formed on a side surface of the sapphire substrate 39. The processing mark 53 may be formed, for example, when cutting a sapphire wafer (not shown) into a sapphire substrate 39 of each device size. Specifically, the processing mark 53 may be a laser mark formed by laser irradiation of a laser machine, for example, before a braking process of the sapphire wafer, or may be an uneven flaw formed by frictional contact between a dicing blade and a cut surface, for example, when a wafer is cut by the dicing blade. This formed processing mark 53 may allow the light generated by the emission layer 44 to be diffused to the end surface of the sapphire substrate 39, so that light extraction efficiency can be improved.

In the light emitting element 7, for example, a substrate such as a GaN substrate, a ZnO substrate, an AlN substrate, an SiC substrate or the like may also be used instead of the sapphire substrate 39.

An n-side terminal 8 is made of, for example, a metal material such as Cu, Ni, Au, Ag, Pd, Sn or the like, and is formed to wrap around the surface 2A and the rear surface 2B of the substrate 2 through the recess 11 of the substrate 2. By forming the n-side insulating protective layer 5 with a dry resist film, the periphery of the n-side insulating protective layer 5 may be precisely defined at a position spaced apart from the recess 11 on the surface 2A of the substrate 2. Thus, since a gap (e.g., about 50 μm) 54 can be formed between the n-side insulating protective layer 5 and the recess 11, the n-side terminal 8 can be advantageously formed on the gap 54. The use of a liquid resist makes it difficult to form the gap 54. Since the n-side terminal 8 is formed on the surface 2A of the substrate 2, as well as on the end surface of the substrate 2 (the recess 11 in this embodiment) and on the rear surface 2B, when the semiconductor light emitting device 1 is mounted, a bonding material such as solder or the like can be caused to wet up to the surface 2A of the substrate 2, so that it is possible to enhance mounting strength. In addition, since the wet state of solder after mounting can be easily checked with the naked eye, it is possible to prevent the outflow of defective mounting. Moreover, in the end surface 2C of the substrate 2, the n-side terminal 8 may have an end surface 81 that is flush with the end surface 2C. This is because, when the semiconductor light emitting device 1 is manufactured, the substrate 2 is cut by dicing, so that the end surface 2C and the end surface 81 simultaneously appear accordingly.

A p-side terminal 9 is made of, for example, a metal material such as Cu, Ni, Au, Ag, Pd, Sn or the like, and is formed to wrap around the surface 2A and the rear surface 2B of the substrate 2 through the recess 11 of the substrate 2. By forming the p-side insulating protective layer 6 with a dry resist film, the periphery of the p-side insulating protective layer 65 may be precisely defined at a position spaced apart from the recess 11 on the surface 2A of the substrate 2. Thus, since a gap (e.g., about 50 μm) 55 can be formed between the p-side insulating protective layer 6 and the recess 11, the p-side terminal 9 can be advantageously formed on the gap 55. Accordingly, similar to the n-side terminal 8, when the semiconductor light emitting device 1 is mounted, it is possible to enhance mounting strength. Furthermore, in the end surface 2E of the substrate 2, the p-side terminal 9 may have an end surface 91 that is flush with the end surface 2E. This is because, when the semiconductor light emitting device 1 is manufactured, the substrate 2 is cut by dicing, so that the end surface 2E and the end surface 91 simultaneously appear accordingly.

Furthermore, in the rear surface 2B of the substrate 2, the n-side terminal 8 and the p-side terminal 9 face each other in the longitudinal direction of the substrate 2. The polarity mark 56 is formed between the n-side terminal 8 and the p-side terminal 9. The polarity mark 56 has a triangular portion 57 with a top portion facing a cathode side, as an anode side (p-side terminal 9 side), and a linear portion 58 extending from the top portion of the triangular portion 57 toward the cathode side (n-side terminal 8 side), based on a diode symbol that conforms to the International Electrotechnical Commission (IEC).

The sealing resin 10 is installed on the substrate 2 so as to cover the light emitting element 7, the bonding wires 51 and 52, the n-side wiring 3 (partially), the p-side wiring (partially), the n-side insulating protective layer 5 (partially), and the p-side insulating protective layer 6 (partially). In this embodiment, the sealing resin 10 has inclined surfaces 59 on both sides of the substrate 2 in the longitudinal direction and has an isosceles trapezoid shape in side surface view.

Meanwhile, as illustrated in FIG. 1, the two side surfaces of the sealing resin 10 in the width direction of the substrate 2 are respectively aligned with the end surfaces 2D and 2F of the substrate 2 and are surfaces vertically standing with respect to the surface 2A of the substrate 2.

Figure 6:
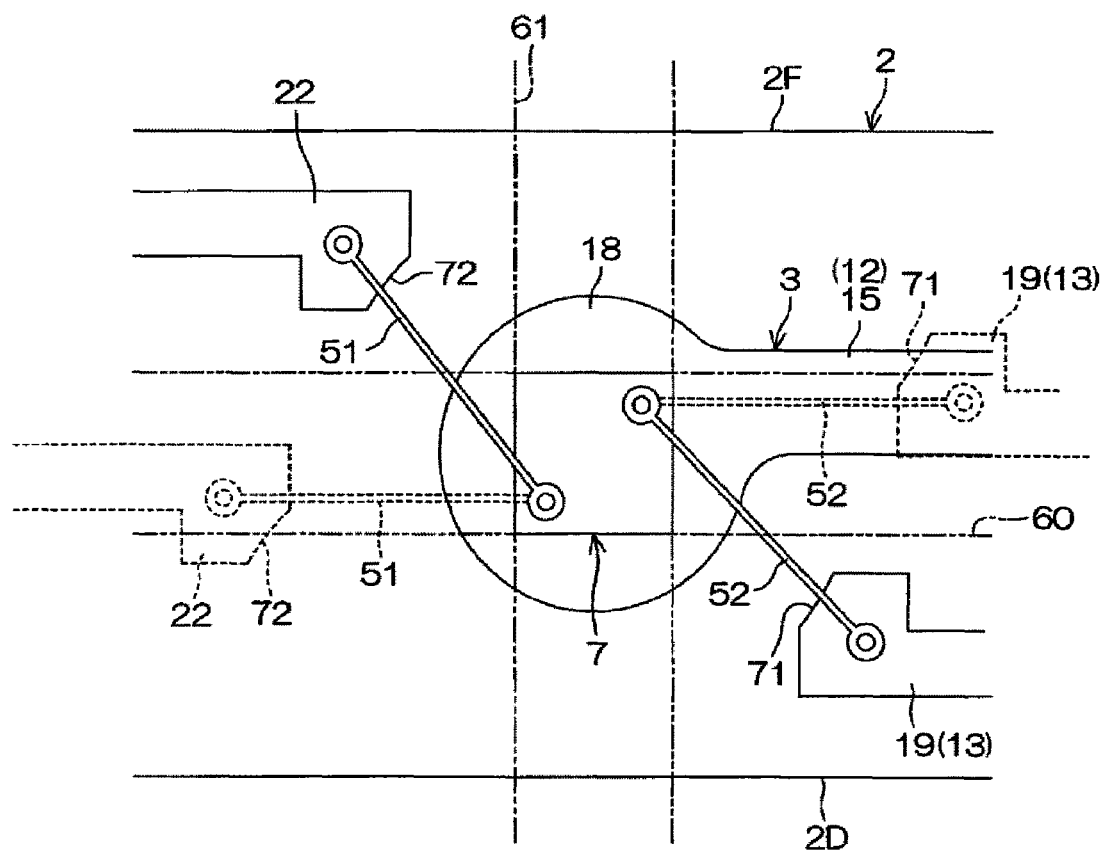
FIG. 6 is a view illustrating a design of a layout pattern of a wire island.

FIG. 6 is a view illustrating a design of a layout pattern of the wire island. In FIG. 6, components necessary for descriptions herein, among the components illustrated in FIG. 1, will be only illustrated and other components will be omitted.

In the semiconductor light emitting device 1 described above, the wire island 19 and the island portion 22 are arranged to cross at the central portion of the element island 18 (the bonding portion of the light emitting element 7) and to avoid a first region 60 in the longitudinal direction (first direction) of the substrate 2 and a second region 61 in the width direction (second direction) of the substrate 2, when viewed in the plan view.

Thus, as indicated by the broken lines in FIG. 6, the islands 19 and 22 may be arranged to be close to the element island 18 while securing a distance required for performing wire bonding, compared with a case where the islands 19 and 22 are arranged on the region 60 or the bonding wire 52 is bonded to the first extending portion 15 extending from the element island 18. That is, since the element island 18 and the wire islands 19 and 22 can be integrated at the central portion of the substrate 2, the substrate 2 can be reduced in size, and as a result, the semiconductor light emitting device 1 can be miniaturized.

In addition, since the bonding wire 52 of the n side is connected to the wire island 19 separated from the element island 18, it is possible to prevent defective wire bonding due to exudation of the die attach agent 38 (see FIG. 5) between the light emitting element 7 and the element island 18. That is, even though the die attach agent 38 exudes up to the first extending portion 15, since the bonding wire 52 is not bonded to the first extending portion 15, the defective wire bonding is eliminated.

Figure 7A:
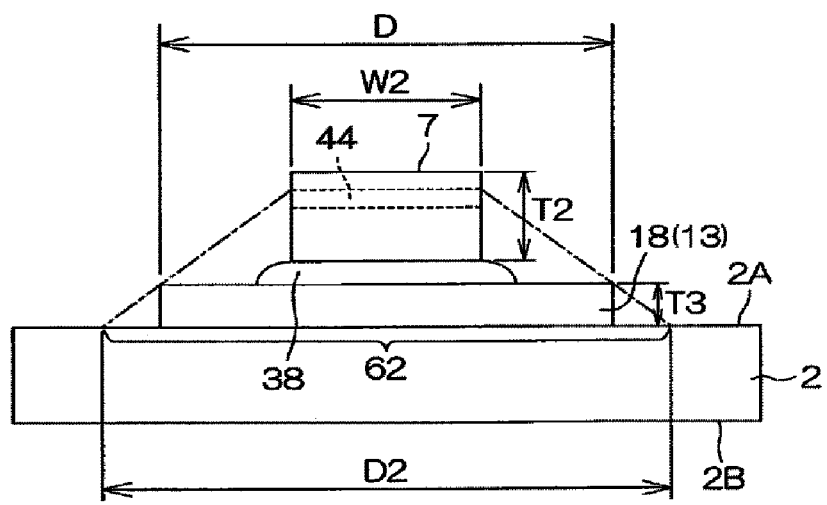
FIGS. 7A and 7B are views illustrating a wiring pattern design of the semiconductor light emitting device.
Figure 7B:
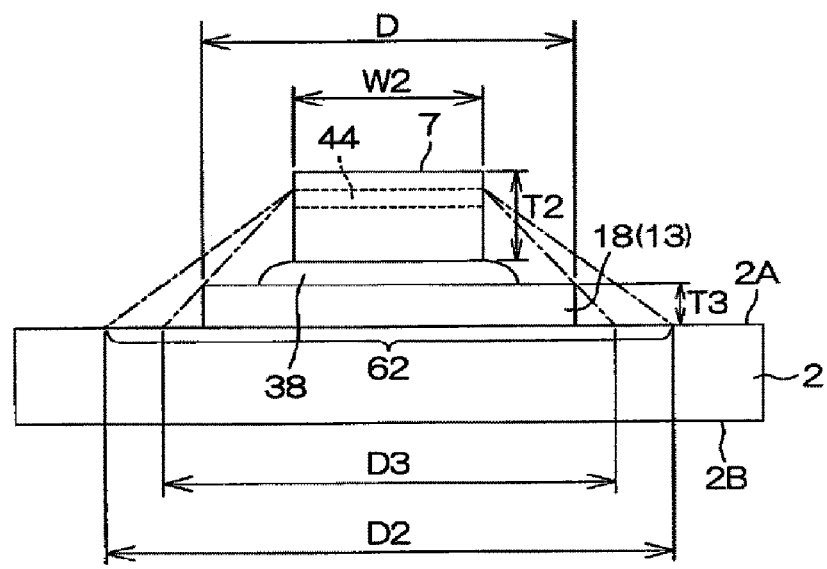

FIGS. 7A and 7B are views illustrating a design of a wiring pattern of the semiconductor light emitting device 1. A design for miniaturizing the semiconductor light emitting device 1 will be further described with reference to FIGS. 7A and 7B.

As illustrated in FIG. 7A, in this embodiment, a thickness T2 of the light emitting element 7 is greater than a thickness T3 of the element island 18. This is because, in the light emitting element 7 of this embodiment, it is necessary to make the thickness T2 large in terms of securing a space for forming the processing mark 53 on the sapphire substrate 39. The thickness T3 of the element island 18 is within a range of, for example, 20 to 45 μm, while the thickness T2 of the light emitting element 7 is within a range of, for example, 50 to 120 μm.

Recently, the reduction in the height of the light emitting elements has been advanced, which results in easily reflecting light generated by the light emitting elements so that light hardly strikes the substrate 2 directly.

Meanwhile, when the relatively thick light emitting element 7 is provided as in this embodiment, it is necessary to appropriately design the size of the element island 18 in order to prevent deterioration of the substrate 2 due to light generated by the emission layer 44 of the light emitting element 7.

For example, the size of the element island 18 is designed based on the thickness T2 and the width W2 of the light emitting element 7. In particular, in the light emitting element 7 of this embodiment, the thickness T2 is increased to fall within a range of 50 to 120 μm and the height position of the emission layer 44 is increased in terms of securing a space for forming the processing mark 53 on the sapphire substrate 39. Thus, since the range of light spreading from the emission layer 44 is larger than that of a relatively thin light emitting device, the design of the size of the element island 18 is important. For example, when the thickness T2 of the light emitting element 7 is 110 μm and the width W2 of the light emitting element 7 is 225 μm, it is desirable that the diameter D of the element island 18 be 490 μm or more. That is, it is necessary that the diameter D of the element island 18 is 2 or more times the width W2 of the light emitting element 7. Thus, since a partial amount of light, which is emitted from the emission layer 44 and intensively strikes a region 62 relatively close to the light emitting element 7, can be reflected at the element island 18, the light incident to the region 62 is reduced. Here, under the above conditions of the thickness T2 and the width W2 of the light emitting element 7, the region 62 where light strikes intensively is inside the circle of diameter D2≈630 μm centered on the center of the element island 18.

However, designing the diameter D of the element island 18 preferentially in consideration of the reduction of light in the region 62 where light strikes intensively may disrupt wire bonding due to too short distance between the element island 18 and the wire islands 19 and 22. Also, the employment thereof may be difficult due to restrictions in design of a line and space (L/S). In addition, if the element island 18 is too large, the sealing resin 10 may likely peel. For example, when the element island 18 is Au, since the adhesion between Au and the resin is not high, a contact area between the element island 18 and the sealing resin 10 is increased, so that the sealing resin 10 may tend to be peeled off due to stress such as a heat cycle or the like.

Here, as illustrated in FIG. 7B, according to the present disclosure, the miniaturized semiconductor light emitting device 1 in which the element island 18 is kept small by allowing a certain amount of light to enter the region 62 where light strikes intensively is provided. For example, under the above conditions of the thickness T2 and the width W2 of the foregoing light emitting element 7, the diameter D of the element island 18 is D≈440 μm. That is, the diameter D of the element island is less than double the width W2 of the light emitting element 7. Thus, since a range D3 for blocking light in the element island 18 is D3≈550 μm, the region 62 having a width of about 80 μm (630-550 μm) where light strikes intensively remains on the substrate 2 as illustrated in FIG. 1.

In order to suppress the deterioration of light of the substrate 2 in the region 62 where light strikes intensively, a light resistant resin is used as the substrate 2 in the semiconductor light emitting device 1. The light resistant resin forming the substrate 2 particularly has resistance to light having a wavelength of, for example, 420 nm or more.

Figure 8A:
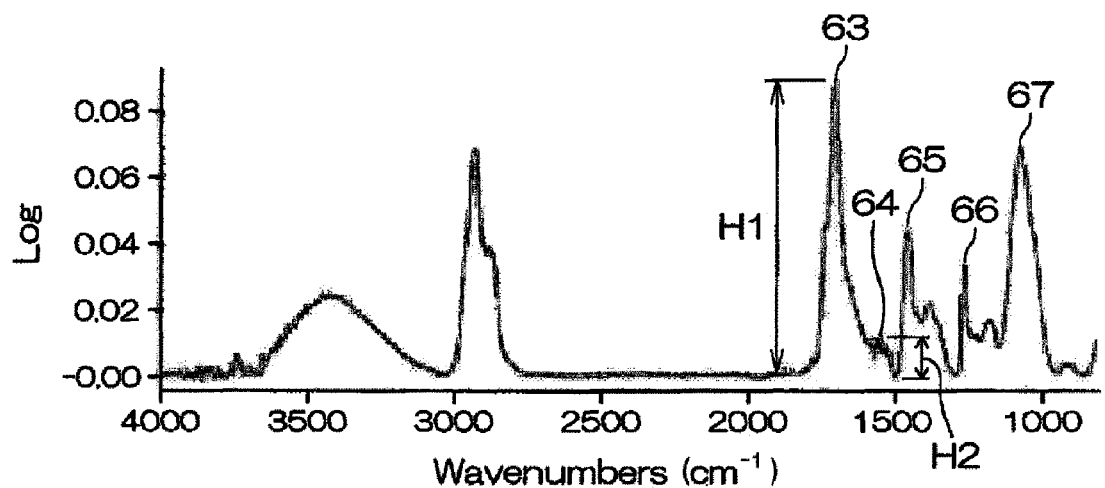
FIG. 8A illustrates an example of an FT-IR spectrum of a substrate of the semiconductor light emitting device.
Figure 8B:
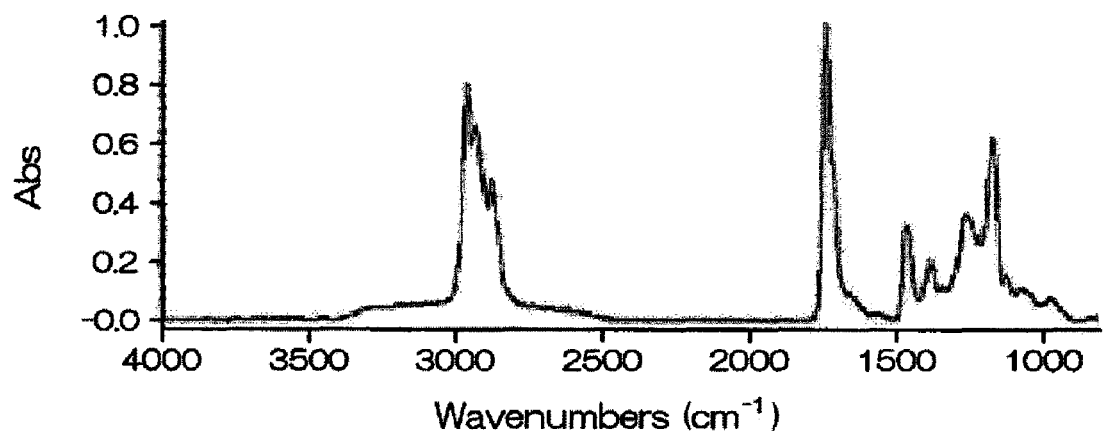
FIG. 8B is a diagram illustrating an example of an FT-IR spectrum of an acrylic resin.
Figure 8C:
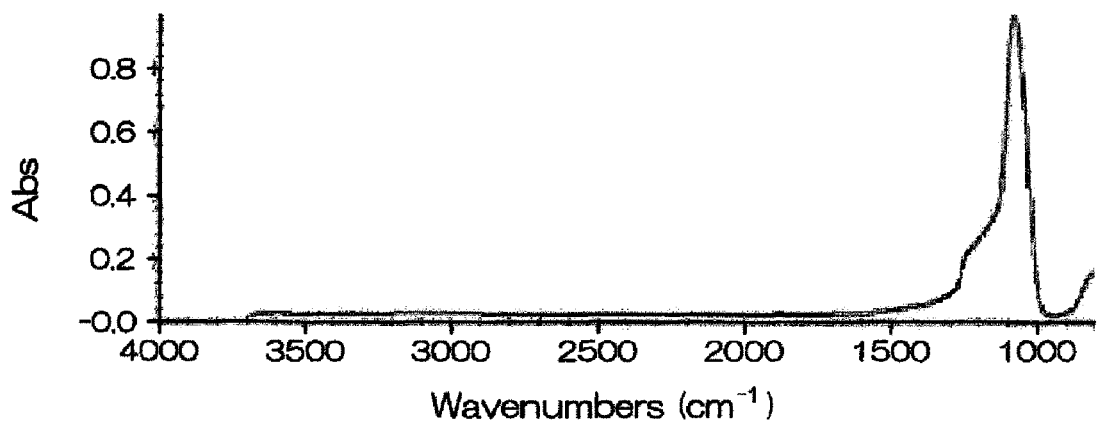
FIG. 8C is a diagram illustrating an example of an FT-IR spectrum of silicone.

FIG. 8A illustrates an example of an FT-IR spectrum of the substrate 2 of the semiconductor light emitting device 1. FIG. 8B is a diagram illustrating an example of an FT-IR spectrum of an acrylic resin. FIG. 8C is a diagram illustrating an example of an RT-IR spectrum of silicone.

Specifically, for example, the substrate 2 may be a resin containing an acrylic resin, and a Fourier transform infrared spectroscopy (FT-IR) spectrum thereof is the same as illustrated in FIG. 8A.

When FIGS. 8A, 8B, and 8C are compared, it can be seen that the spectrum of FIG. 8A is obtained by superimposing the spectrum of the acrylic resin illustrated in FIG. 8B and the spectrum of silicone illustrated in FIG. 8C. Specifically, the resin of the substrate 2 illustrated in FIG. 8A exhibits a spectrum including at least a first peak 63 near a wavenumber of 1,698 $cm^{-1}$, a second peak 64 near a wavenumber of 1,510 $cm^{-1}$, a third peak 65 near a wavenumber of 1,448 $cm^{-1}$, a fourth peak 66 near a wavenumber of 1,257 $cm^{-1}$, and a fifth peak 67 near a wavenumber of 1,060 $cm^{-1}$, and a peak height H1 of the first peak 63 is higher than a peak height H2 of the second peak 64. The first peak 63 is a peak derived from a C=0 bond, the second peak 64 is a peak derived from a benzene ring, and the fifth peak 67 is a peak derived from an Si—O—Si bond. Furthermore, the FT-IR spectrum of the substrate 2 does not have a peak of the spectrum in a wavenumber region between the first peak 63 and the second peak 64 and between the second peak 64 and the third peak 65.

The substrate 2 may be formed by impregnating a resin in which an acrylic resin (e.g., a polymethyl methacrylate resin or the like) and silicone is mixed at a predetermined mixing ratio to glass cloth so as to have, for example, the spectrum illustrated in FIG. 8A.

Meanwhile, in the semiconductor light emitting device 1, the light resistant resin is also used in the sealing resin 10, as well as in the substrate 2. The sealing resin 10 is a resin containing silicone.

Figure 9A:
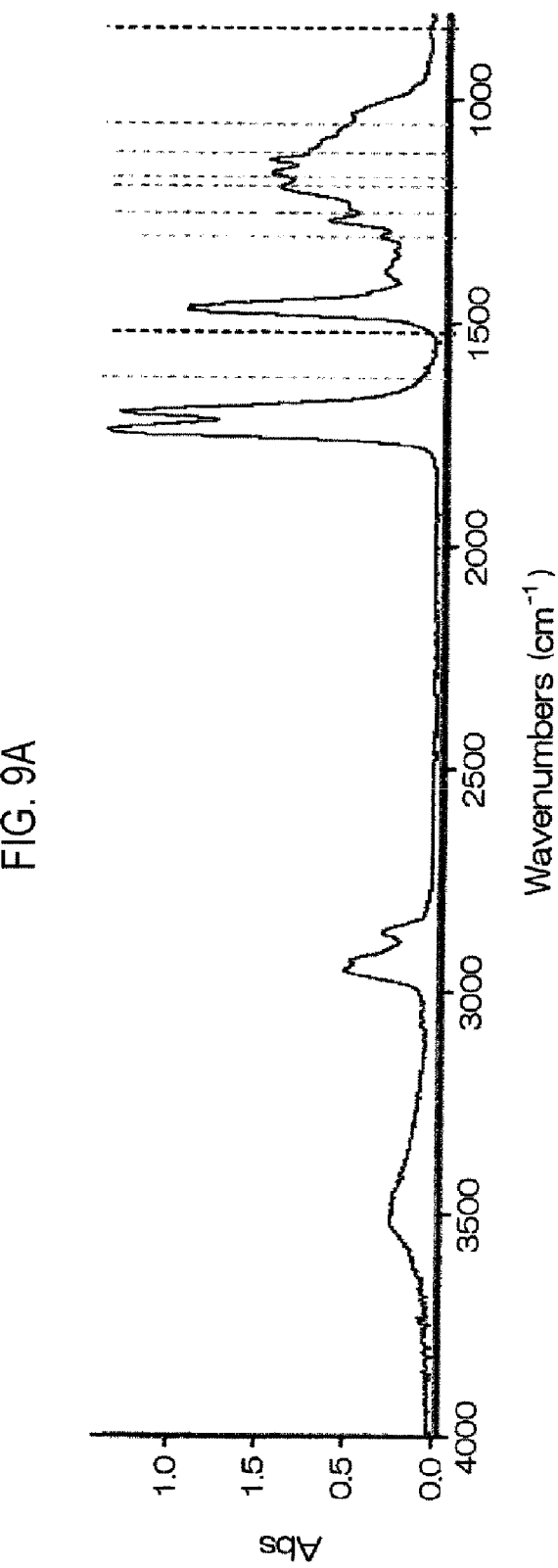
FIG. 9A is a diagram illustrating an example of an FT-IR spectrum of a sealing resin of the semiconductor light emitting device.
Figure 9B:
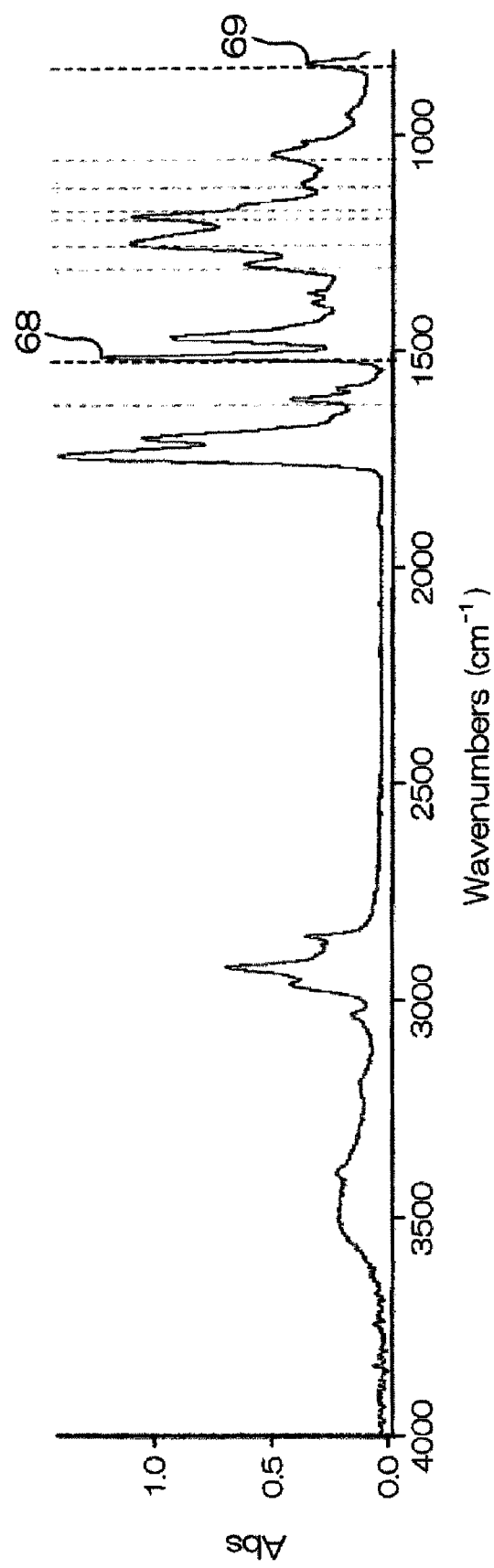
FIG. 9B is a diagram illustrating an example of an FT-IR spectrum of an epoxy resin.

FIG. 9A is a diagram illustrating an example of an FT-IR spectrum of the sealing resin 10 of the semiconductor light emitting device 1. FIG. 9B is a diagram illustrating an example of an FT-IR spectrum of an epoxy resin.

When FIGS. 9A and 9B are compared, it can be seen that, with respect to a reference spectrum obtained by FT-IR measuring an epoxy resin derived from bisphenol A, the spectrum of the sealing resin 10 illustrated in FIG. 9A does not include a peak 68 near a wavenumber of 1,510 $cm^{-1}$ and a peak 69 near a wavenumber of 835 $cm^{-1}$ included in the reference spectrum and exhibits a spectrum including peaks at the same wavenumber positions of a plurality of peaks of the reference spectrum.

As described above, as illustrated in FIG. 9B, in the substrate 2 and the sealing resin 10, a peak (near 1,510 $cm^{-1}$) derived from a benzene ring, which is contained in the conventional epoxy resin largely, is decreased. That is, since the substrate 2 and the sealing resin 10 have a small amount of the benzene ring which is cleaved by light excitation and yellows the resin, the substrate 2 and the sealing resin 10 are suppressed from yellowing although exposed to light for a long period of time. As a result, it is possible to provide the semiconductor light emitting device 1 capable of realizing a high lifespan and a high output.

While the embodiment of the present disclosure has been described above, the present disclosure may be implemented in different forms.

Figure 10:
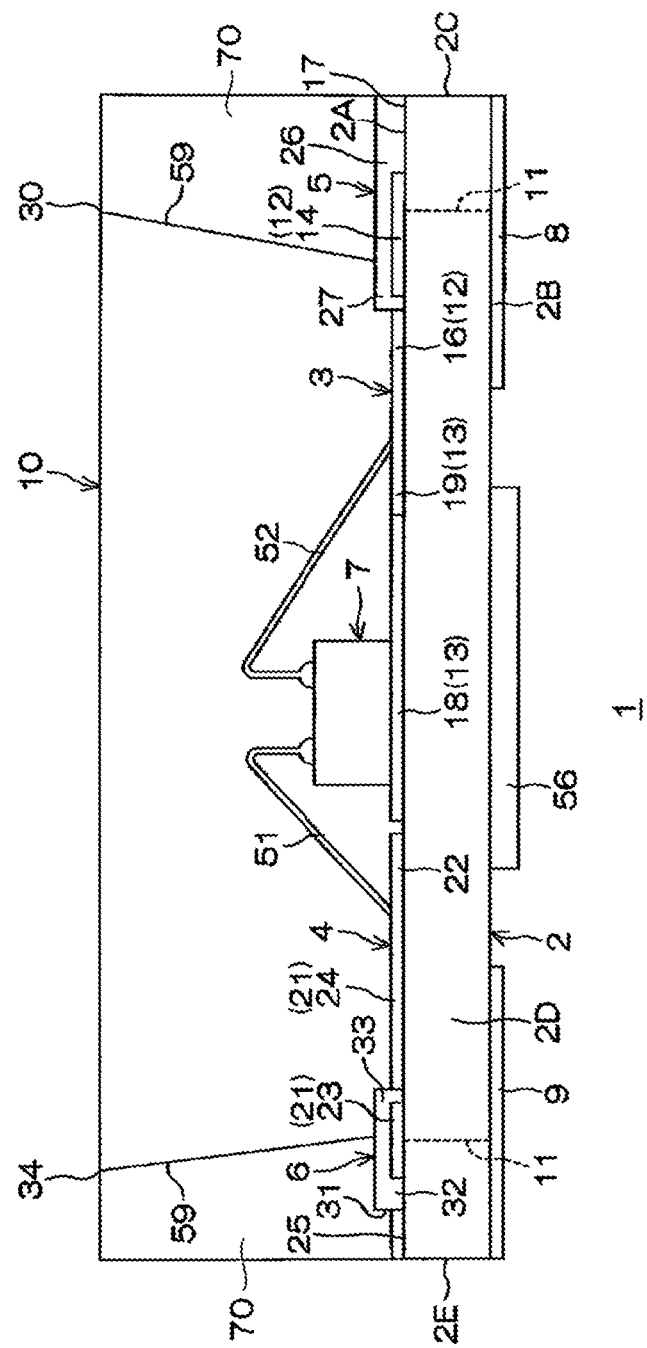
FIG. 10 is a side view of a semiconductor light emitting device according to another embodiment of the present disclosure.

For example, in the semiconductor light emitting device 1, a reflector 70 for reflecting light generated by the light emitting element 7 may be installed around the sealing resin 10, as shown in FIG. 10. Further, the sealing resin 10 may be formed in a reversed isosceles trapezoid shape compared with that of the sealing resin shown in FIG. 3.

Furthermore, the present disclosure may be differently modified in design within the scope of the subject matters described in the claims.

In addition, in the aforementioned embodiment, the disclosures having the following configurations may be extracted as reference disclosures of the disclosure described in the claims.

That is to say, a semiconductor light emitting device according to one embodiment of the reference disclosure includes a substrate, a first wiring and a second wiring formed on the substrate, and a light emitting element disposed on the substrate and electrically connected to the first wiring and the second wiring, and a transparent sealing resin for sealing the light emitting element, wherein the first wiring includes a first island on which the light emitting element is mounted and a second island connected to the light emitting element by a first bonding member, and wherein the second island is disposed to cross at the position of the light emitting element and avoid a first region in a first direction of the substrate and a second region in a second direction intersecting the first direction of the substrate.

In the semiconductor light emitting device according to one embodiment of the reference disclosure, the second wiring includes a third island connected to the light emitting element by a second bonding member, and the third island may be disposed at a position diagonal to the second island with the first islands interposed therebetween.

The semiconductor light emitting device according to one embodiment of the reference disclosure further includes a first insulating protective layer formed on the substrate so as to selectively cover the first wiring, and a second insulating protective layer formed on the substrate so as to selectively cover the second wiring, wherein the first insulating protective layer and the second insulating protective layer may be formed to have different patterns in the plan view.

In the semiconductor light-emitting device according to one embodiment of the reference disclosure, a first recess is formed on the substrate so as to penetrate from the surface to the rear surface of the substrate, the first insulating protective layer is formed along a periphery of the first recess so that the first gap is formed between itself and the first recess, and the semiconductor light emitting device may include a first terminal which is formed so as to wrap around the rear surface of the substrate from the first gap through the first recess and connected to the first wiring.

In the semiconductor light emitting device according to one embodiment of the reference disclosure, a second recess is formed on the substrate so as to penetrate from the surface to the rear surface of the substrate, and the second insulating protective layer is formed along a periphery of the second recess so that the second gap is formed between itself and the second recess, and the semiconductor light emitting device may include a second terminal which is formed so as to wrap around the rear surface of the substrate from the second gap through the second recess and connected to the second wiring.

In the semiconductor light emitting device according to one embodiment of the reference disclosure, the first insulating protective layer and the second insulating protective layer may be formed as a dry resist film.

EXAMPLES

Next, the present disclosure will be described based on examples and comparative examples, but the present disclosure is not limited by the following examples.

As a sample for evaluation of example 1 and comparative example 1, a semiconductor light emitting device was fabricated by modifying the structure illustrated in FIGS. 1 to 3. The materials of a substrate 2 and a sealing resin 10 used in example 1 and comparative example 1 are as follows.

Example 1

Substrate 2: Acrylic resin
Sealing resin 10: Epoxy resin containing silicone

Comparative Example 1

Substrate 2: Epoxy resin containing BT resin
Sealing resin 10: Epoxy resin containing silicone A conduction test (test conditions: Ta=85 degrees C. and IF=20 mA) was performed on the obtained evaluation sample, and the results shown in the following Table 1 and FIG. 11 were obtained. In Table 1 and FIG. 11, the luminous intensity at the initial stage of the conduction test is 100% and the magnitude of luminous intensity thereof is exhibited as a rate of change in luminous intensity.

TABLE 1

| | Conduction time (h) | | | | |
|---|---|---|---|---|---|
| | 1 | 120 | 240 | 480 | 1,000 |
| Example 1 | 100% | 101% | 101% | 99% | 99% |
| Comparative example 1 | 100% | 97% | 79% | 67% | 37% |

Figure 11:
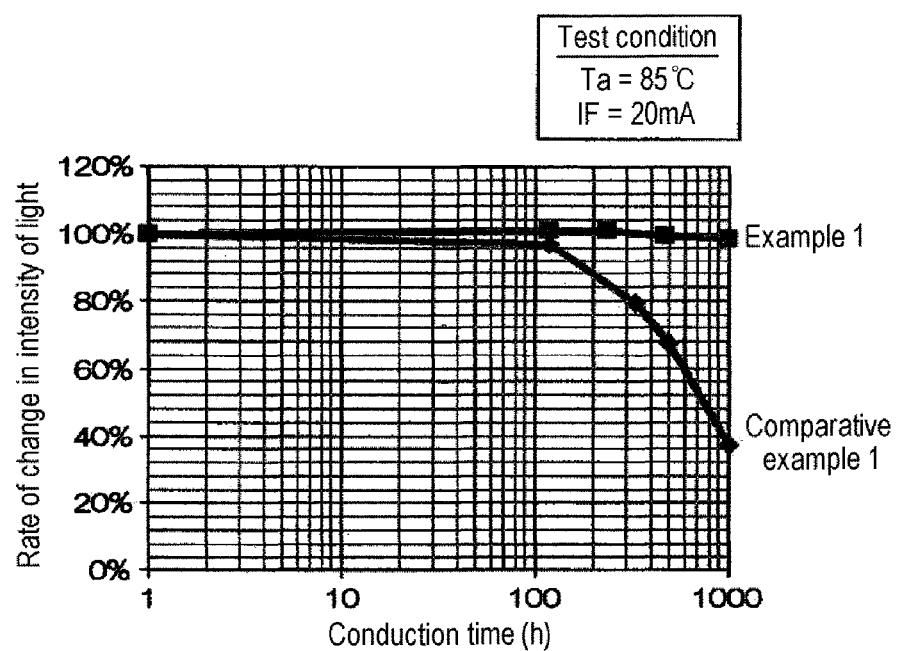
FIG. 11 is a diagram illustrating a result of a conduction test.

As shown in Table 1 and FIG. 11, in example 1, almost the same luminous intensity as at the initial stage of the test was maintained even after 1,000 hours of conduction test, whereas in comparative example 1, the luminous intensity was abruptly decreased nearly from the lapse of 100 hours and the luminous intensity after the lapse of 1,000 hours was lowered to less than 40% of the initial luminous intensity.

According to the present disclosure in some embodiments, it is possible to provide a semiconductor light emitting device in which both a substrate and a sealing resin have high heat resistance and high light resistance, and can realize a long lifespan and a high output.

While certain embodiments have been described, these embodiments have been presented via example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light emitting device, comprising:
a substrate including a first surface and containing acrylic resin;
a first conductive part and a second conductive part which are formed on the first surface of the substrate and that are spaced apart from each other;
a light emitting element disposed on the first surface of the substrate and that is electrically connected to the first conductive part and the second conductive part;
a resin part configured to cover the light emitting element and that contains silicone; and
a first insulating layer which covers the first conductive part and a second insulating layer which covers the second conductive part,
wherein the first surface includes a first side, a second side, a third side, and a fourth side when viewed in a first direction perpendicular to the first surface,
wherein the first side and the second side face each other in a second direction orthogonal to the first direction, the third side and fourth side face each other in a third direction orthogonal to the second direction, and lengths of the first side and the second side are shorter than lengths of the third side and the fourth side,
wherein a length of the first insulating layer in the second direction is shorter than a length of the second insulating layer in the second direction, and
wherein the first conductive part includes an element island on which the light emitting element is mounted, the element island is light-reflective and is formed on the first surface of the substrate.

2. The device of claim 1, further comprising a first wire which connects the first conductive part and the light emitting element.

3. The device of claim 2, wherein the first conductive part includes:
first portion which is connected to the first wire; and
a second portion which is connected to the first portion and has a width narrower than a width of the first portion.

4. The device of claim 3, wherein the first conductive part further includes a third portion, which is connected to the second portion and has a width wider than the width of the first portion and the width of the second portion.

5. The device of claim 4, wherein the second conductive part includes a fourth portion interposed between the light emitting element and the substrate.

6. The device of claim 5, wherein the first portion includes a first curved portion,
wherein the fourth portion includes a second curved portion, and
wherein the first curved portion and the second curved portion face each other in the second direction and the third direction.

7. The device of claim 5, wherein the second conductive part includes a fifth portion, which is connected to the fourth portion and has a width narrower than a width of the light emitting element, when viewed in the first direction.

8. The device of claim 7, wherein the second conductive part includes a sixth portion, which is connected to the fifth portion and has a width wider than the width of the light emitting element and the width of the fifth portion, when viewed in the first direction.

9. The device of claim 8, wherein the second conductive part includes a seventh portion, which is connected to the sixth portion and has a width narrower than the width of the fifth portion, when viewed in the first direction.

10. The device of claim 9, wherein the second conductive part includes an eighth portion, which is connected to the seventh portion and has a width wider than the width of the seventh portion, when viewed in the first direction.

11. The device of claim 10, wherein the eighth portion includes a third curved portion,
wherein the fourth portion includes a fourth curved portion, and
wherein the third curved portion and the fourth curved portion face each other in the second direction and the third direction.

12. The device of claim 10, wherein the first portion and the second portion are spaced apart from the seventh portion and the eighth portion when viewed in the second direction.

13. The device of claim 10, wherein the seventh portion and the eighth portion overlap the fifth portion and are spaced apart from the fourth portion, when viewed in the third direction.

14. The device of claim 10, further comprising a second wire which connects the second conductive part and the light emitting element.

15. The device of claim 14, wherein the second wire is connected to the eighth portion.

16. The device of claim 15, wherein a connection point of the eighth portion and the second wire deviates from a center of the light emitting element in the second direction and the third direction, when viewed in the first direction.

17. The device of claim 15, wherein a connection point of the light emitting element and the second wire deviates from a center of the light emitting element in the second direction and the third direction, when viewed in the first direction.

18. The device of claim 8, wherein the sixth portion overlaps the third side and the fourth side when viewed in the first direction.

19. The device of claim 4, wherein the third portion overlaps the third side and the fourth side when viewed in the first direction.

20. The device of claim 2, wherein a connection point of the light emitting element and the first wire deviates from a center of the light emitting element in the second direction and the third direction, when viewed in the first direction.

21. The device of claim 3, wherein a connection point of the first portion and the first wire deviates from a center of the light emitting element in the second direction and the third direction, when viewed in the first direction.

22. The device of claim 1, wherein end portions of the first insulating layer and the second insulating layer are inclined.

23. The device of claim 1, wherein the first insulating layer includes a portion interposed between the first conductive part and the resin part, and a portion exposed from the resin part, and
wherein the second insulating layer includes a portion interposed between the second conductive part and the resin part, and a portion exposed from the resin part.

24. The device of claim 1, wherein the first insulating layer is spaced apart from the first side when viewed in the first direction.

25. The device of claim 1, wherein the second insulating layer overlaps the second side when viewed in the first direction.

26. The device of claim 1, wherein a first recess is formed in the first side to penetrate the substrate in the first direction, and
wherein the first insulating layer is formed along a periphery of the first recess with a first gap between the first insulating layer and the first recess.

27. The device of claim 26, wherein the substrate further includes a second surface which is opposite to the first surface in the first direction, and
wherein a first terminal is formed from the first gap through the first recess to wrap around the second surface of the substrate, and connected to the first conductive part.

28. The device of claim 27, wherein a second recess is formed in the second side to penetrate the substrate in the first direction, and
wherein the second insulating layer is formed along a periphery of the second recess with a second gap between the second insulating layer and the second recess.

29. The device of claim 28, wherein a second terminal is formed from the second gap through the second recess to wrap around the second surface of the substrate, and connected to the second conductive part.

30. The device of claim 29, wherein the first terminal and the second terminal face each other, in the second direction, on the second surface of the substrate.

31. The device of claim 30, wherein a polarity mark is formed between the first terminal and the second terminal on the second surface, and
wherein the polarity mark includes:
a triangular portion with a top portion facing the first side; and
a linear portion extending from the top portion of the triangular portion toward the second side.

32. The device of claim 31, wherein the polarity mark overlaps the light emitting element when viewed in the first direction.

33. The device of claim 31, wherein a thickness of the polarity mark is thicker than a thickness of the first terminal and a thickness of the second terminal.

34. The device of claim 1, wherein the substrate contains glass cloth.

35. The device of claim 1, wherein the substrate exhibits a spectrum including at least a first peak near a wavenumber of 1,698 cm-1, a second peak near a wavenumber of 1,510 cm-1, and a third peak near a wavenumber of 1,448 cm-1 in FT-IR measurement, and is made of a light resistant resin in which a peak height of the first peak is higher than a peak height of the second peak.

36. The device of claim 35, wherein the substrate exhibits a spectrum further including a fourth peak near a wavenumber of 1,257 cm-1 and a fifth peak near a wavenumber of 1,060 cm-1 in the FT-IR measurement.

37. The device of claim 35, wherein, with respect to a reference spectrum obtained by FT-IR measuring an epoxy resin derived from bisphenol A in the FT-IR measurement, the resin part does not include peaks near wavenumbers of 1,510 cm-1 and 835 cm-1 included in the reference spectrum and is made of a light resistant resin that exhibits a spectrum including peaks at the same wavenumber positions of a plurality of peaks of the reference spectrum.

38. The device of claim 1, wherein the substrate is made of a resin that exhibits a spectrum including a peak derived from a C=O bond, a peak derived from a benzene ring, and a peak derived from an Si—O—Si bond in FT-IR measurement.

39. A semiconductor light emitting device, comprising:
a substrate which includes a first surface and is made of resin;
a first conductive part and a second conductive part which are formed on the first surface of the substrate and that are spaced apart from each other;
a light emitting element disposed on the substrate and that is electrically connected to the first conductive part and the second conductive part;
a transparent sealing resin part configured to seal the light emitting element and that contains silicone; and
a first insulating protective layer formed on the first surface of the substrate to selectively cover the first conductive part and a second insulating protective layer formed on the first surface of the substrate to selectively cover the second conductive part,
wherein the first insulating protective layer and the second insulating protective layer are formed to have different patterns in a plan view,
wherein the substrate contains a resin component having a C=O bond, a benzene ring, and an Si—O—Si bond, wherein the first conductive part includes a first island on which the light emitting element is mounted, the first island is light-reflective and is formed on the first surface of the substrate, wherein the first conductive part includes a second island formed on the first surface of the substrate and connected to the light emitting element by a first bonding member, and wherein the second island is disposed to cross at a position of the light emitting element and avoid a first region in a first direction of the substrate and a second region in a second direction intersecting the first direction of the substrate.

40. The device of claim 39, wherein the second conductive part includes a third island connected to the light emitting element by a second bonding member, and wherein the third island is disposed at a position diagonal to the second island with the first island interposed therebetween.

41. The device of claim 39, wherein the substrate further includes a second surface which is opposite to the first surface in the first direction, wherein a first recess is formed in the first side to penetrate the substrate from the first surface to the second surface, and wherein the first insulating protective layer is formed along a periphery of the first recess with a first gap between the first insulating protective layer and the first recess.

42. The device of claim 41, wherein a first terminal is formed from the first gap through the first recess to wrap around the second surface, and connected to the first conductive part.

43. The device of claim 39, wherein the substrate further includes a second surface which is opposite to the first surface in the first direction, wherein a second recess is formed in a second side of the substrate to penetrate the substrate from the first surface to the second surface, and wherein the second insulating protective layer is formed along a periphery of the second recess with a second gap between the second insulating protective layer and the second recess.

44. The device of claim 43, wherein a second terminal is formed from the second gap through the second recess to wrap around the second surface of the substrate, and connected to the second conductive part.

45. The device of claim 39, wherein the first insulating protective layer and the second insulating protective layer are formed as a dry resist film.

46. The device of claim 39, wherein the substrate contains glass cloth.

* * * * *